(12) United States Patent
Shiratori et al.

(10) Patent No.: US 8,093,587 B2
(45) Date of Patent: Jan. 10, 2012

(54) ORGANIC EL DEVICE AND PROCESS OF PRODUCING THE SAME

(75) Inventors: Koya Shiratori, Matsumoto (JP); Hidekazu Kobayashi, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 217 days.

(21) Appl. No.: 12/501,028

(22) Filed: Jul. 10, 2009

(65) Prior Publication Data

US 2010/0051991 A1    Mar. 4, 2010

(30) Foreign Application Priority Data

Aug. 27, 2008   (JP) ................................. 2008-218045

(51) Int. Cl.
*H01L 29/08* (2006.01)
(52) U.S. Cl. .................... 257/40; 257/E51.019; 438/99
(58) Field of Classification Search .................... 257/40, 257/E51.019; 438/99
See application file for complete search history.

(56) References Cited

U.S. PATENT DOCUMENTS

| | | | |
|---|---|---|---|
| 7,247,984 B2 * | 7/2007 | Tanase et al. ................. | 313/506 |
| 7,255,939 B2 * | 8/2007 | Carter et al. .................. | 428/690 |
| 7,400,090 B1 * | 7/2008 | Berger et al. ................. | 313/506 |
| 2001/0051284 A1 * | 12/2001 | Ueda et al. .................... | 428/690 |
| 2004/0239239 A1 | 12/2004 | Fukase | |

FOREIGN PATENT DOCUMENTS

JP    A-2004-311403    11/2004

* cited by examiner

*Primary Examiner* — Trung Q Dang
(74) *Attorney, Agent, or Firm* — Oliff & Berridge, PLC

(57) ABSTRACT

An organic EL device includes a light-emitting element having a first electrode disposed above a substrate, a second electrode arranged above the first electrode, and a light emission functional layer arranged between the first and second electrodes. The second electrode includes a mixture layer composed of a mixture of an electron-injecting material and a reducing material for reducing the electron-injecting material and a transparent electrically conductive layer formed on the mixture layer.

6 Claims, 6 Drawing Sheets

FIG. 5

| | Rs [Ω/□] | LUMINANCE [cd/m²] | VOLTAGE [V] | CURRENT EFFICIENCY [cd/A] | CHROMATICITY | |
|---|---|---|---|---|---|---|
| | | | | | X | Y |
| COMPARATIVE EMBODIMENT | 16.1 | 927.0 | 6.8 | 5.3 | 0.226 | 0.554 |
| EMBODIMENT | 10.9 | 977.5 | 6.7 | 5.6 | 0.227 | 0.548 |

STEP A1

STEP A2

STEP A3

STEP A4

STEP A5

STEP A6

STEP A7

STEP A8

ORGANIC EL DEVICE AND PROCESS OF PRODUCING THE SAME

BACKGROUND

1. Technical Field

The present invention relates to an organic EL device and a process of producing the same.

2. Related Art

Light-emitting elements such as an organic light-emitting diode (hereinafter, referred to as "OLED"), which is called an organic EL (electroluminescent) element, a light-emitting polymer element, or the like, generally have a structure in which a light-emitting layer formed of, for example, an organic EL material is disposed between two electrodes. For example, JP-A-2004-311403 discloses a light-emitting element configured of a reflective electrode disposed on a substrate, a light-emitting layer disposed on the electrode, a reduction layer disposed on the light-emitting layer, and a transparent electrically conductive film disposed on the reduction layer.

The reduction layer in JP-A-2004-311403 enhances the injection of electrons to the light-emitting layer and is composed of a metal compound layer disposed on the light-emitting layer and a reducing metal layer disposed on the metal compound layer. In JP-A-2004-311403, the metal compound layer is made of lithium fluoride, and the reducing metal layer is made of aluminum. The lithium fluoride is reduced by the aluminum to simple lithium ($3LiF+Al \rightarrow 3Li+AlF_3$). The simple lithium is doped on the light-emitting layer. This enhances the injection of electrons to the light-emitting layer.

The light-emitting element in JP-A-2004-311403 is utilized in a top-emission light-emitting device. The reducing metal layer formed of a simple metal such as aluminum desirably has a minimized thickness for efficiently extracting light emitted by the light-emitting layer to the observing side. However, when the thickness of the reducing metal layer is not larger than a predetermined level, the metal atoms aggregate into island-like shapes to form a discontinuous film. This causes problems of deterioration in the electrical conductivity and optical characteristics of the light-emitting device.

SUMMARY

An advantage of some aspects of the invention is that deteriorations of the electrical conductivity and the optical characteristics of a light-emitting device are suppressed.

An organic EL device according to an aspect of the invention includes a light-emitting element having a first electrode disposed above a substrate (including not only a structure in which the first electrode is directly disposed on a substrate but also a structure in which a light-reflecting layer is disposed between the first electrode and a substrate), a second electrode arranged above the first electrode, and a light emission functional layer arranged between the first and second electrodes. The second electrode includes a mixture layer that is composed of a mixture of an electron-injecting material and a reducing material for reducing the electron-injecting material and a transparent electrically conductive layer that is disposed on the mixture layer.

In the aspect of the invention, since the electron-injecting material and the reducing material for reducing the electron-injecting material are mixed to form one layer, the electron-injecting material molecules intervene between metal atoms constituting the reducing material. Consequently, the metal atoms are inhibited from aggregating into island-like shapes. Therefore, the mixture layer formed on the light emission functional layer can be a flat continuous film. This can provide an advantage that deteriorations of the electrical conductivity and the optical characteristics of the organic EL device are suppressed.

In the organic EL device according to an aspect of the invention, the electron-injecting material is preferably composed of a metal compound containing any of alkali metals, alkaline-earth metals, and rare-earth metals (for example, a halide or an oxide of any of alkali metals, alkaline-earth metals, and rare-earth metals). Examples of the alkali metals, alkaline-earth metals, and rare-earth metals include Li, Ca, Sr, Ba, Nd, Sm, Yb, and Mg.

More specifically, the electron-injecting material can be made of lithium fluoride, and the reducing material can be made of aluminum.

In the organic EL device according to an aspect of the invention, the thickness of the mixture layer is preferably 5 nm or less. In this case, the light emitted by the light emission functional layer can be efficiently extracted to the observing side.

In the organic EL device according to an aspect of the invention, the first electrode may be formed of a metal having light reflectivity, or a light-reflecting layer may be arranged between the substrate and the first electrode having translucency.

A process of producing an organic EL device according to an aspect of the invention includes the steps of forming a first electrode on a substrate (the first electrode may be directly formed on the substrate or may be formed on a thin film, such as a light-reflecting layer, formed on the substrate), forming a light emission functional layer on the first electrode, forming a mixture layer on the light emission functional layer, and forming an electrically conductive layer on the mixture layer. The mixture layer is formed by codepositing an electron-injecting material and a reducing material on the light emission functional layer. In this step, since the mixture layer is formed by codepositing the electron-injecting material and the reducing material on the light emission functional layer, the electron-injecting material molecules intervene between the metal atoms constituting the reducing material. Consequently, the metal atoms are inhibited from aggregating into island-like shapes.

In the process of producing the organic EL device according to an aspect of the invention, in the step of forming the mixture layer on the light emission functional layer, the deposition rate ratio of the electron-injecting material to the reducing material (deposition rate of the electron-injecting material/deposition rate of the reducing material) is preferably within the range of 0.1 to 10.

The process of producing the organic EL device according to an aspect of the invention may further include the step of forming a light-reflecting layer on the substrate before the formation of the first electrode.

BRIEF DESCRIPTION OF THE DRAWINGS

The invention will be described with reference to the accompanying drawings, wherein like numbers reference like elements.

FIG. 5 is a diagram showing measurement results of various types of data.

FIG. 63 is a process diagram illustrating the process of producing the light-emitting element.

DESCRIPTION OF EXEMPLARY EMBODIMENTS

Figure 1:
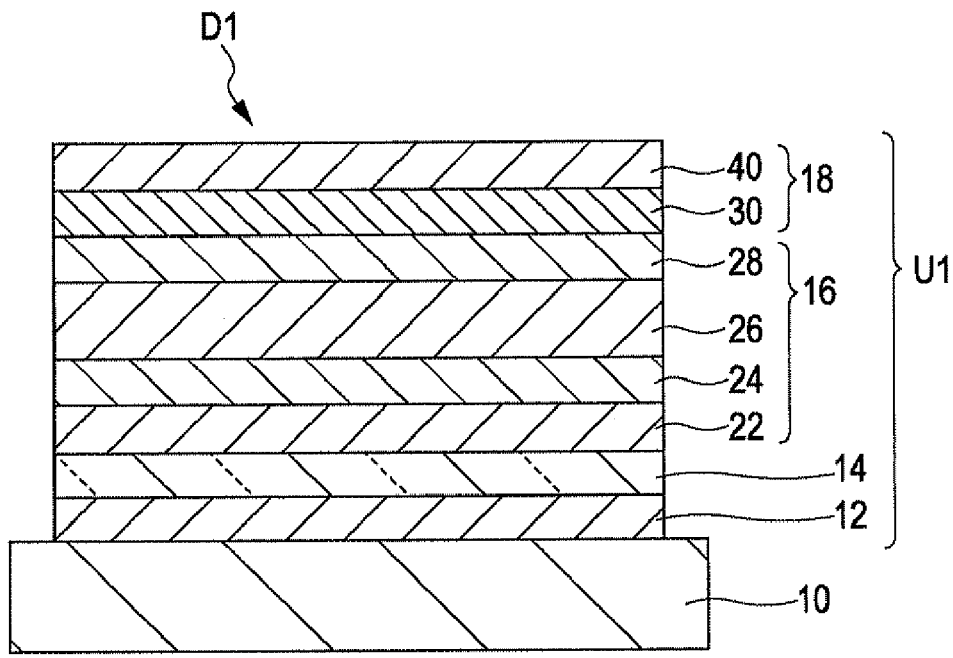
FIG. 1 is a schematic cross-sectional view showing an outline of an organic EL device according to an embodiment of the invention.

Various embodiments according to the invention will now be described with reference to the accompanying drawings. The size ratios of the respective portions in the drawings are appropriately different from actual sizes.

A: Structure of Organic EL Device

FIG. 1 is a schematic cross-sectional view showing an outline of an organic EL device D1 according to an embodiment of the invention. The organic EL device D1 has a structure in which a plurality of light-emitting elements U1 are arrayed on a surface of a substrate 10, but in FIG. 1, a single light-emitting element U1 is exemplary shown for convenience of description. The organic EL device D1 of this embodiment is a top-emission type, and light generated by the light-emitting element U1 travels in the direction opposite to the substrate 10. Accordingly, the substrate 10 is not limited to a plate having optical transparency such as a glass plate and may be an opaque plate such as a ceramic plate or a metal sheet.

The substrate 10 is provided with wiring (not shown) for supplying electricity to the light-emitting element U1 for emitting light. In addition, the substrate 10 is provided with a circuit (not shown) for supplying electricity to the light-emitting element U1.

The light-emitting element U1 includes a pixel electrode 14 (first electrode) disposed above the substrate 10, an opposite electrode 18 (second electrode) arranged above the pixel electrode 14, and a light emission functional layer 16 arranged between the pixel electrode 14 and the opposite electrode 18. The detail will be described below. As shown in FIG. 1, a light-reflecting layer 12 is formed on the substrate 10. The light-reflecting layer 12 is made of a material having light reflectivity. Such a material is preferably a simple metal such as aluminum (Al) or silver (Ag) or an alloy whose main component is Al or Ag. In the embodiment, the light-reflecting layer 12 is formed of AlNd.

As shown in FIG. 1, the pixel electrode 14 is formed on the light-reflecting layer 12. The pixel electrode 14 is an anode and is made of a transparent electrically conductive oxide such as ITO (indium tin oxide), IZO (indium zinc oxide, registered trademark of Idemitsu Kosan Co., Ltd.), or $ZnO_2$. In the embodiment, the pixel electrode 14 is formed of ITO. Furthermore, in the embodiment, the pixel electrode 14 is disposed on the light-reflecting layer 12 that is disposed on the substrate 10, but the invention is not limited to this configuration. For example, the pixel electrode 14 may be directly disposed on the substrate 10 without arranging the light-reflecting layer 12 therebetween. In such a case, the pixel electrode 14 is formed of a metal having light reflectivity.

As shown in FIG. 1, the light emission functional layer 16 is composed of a hole-injecting layer 22 disposed on the pixel electrode 14, a hole-transporting layer 24 disposed on the hole-injecting layer 22, a light-emitting layer 26 disposed on the hole-transporting layer 24, and an electron-transporting layer 28 disposed on the light-emitting layer 26.

In the embodiment, the hole-injecting layer 22 is formed of CuPc (copper phthalocyanine), and the hole-transporting layer 24 is formed of α-NPD. Furthermore, the hole-injecting layer 22 and the hole-transporting layer 24 can be formed of a single layer having both functions of the hole-injecting layer 22 and the hole-transporting layer 24.

The light-emitting layer 26 is formed of an organic EL material that emits light by recombination of holes and electrons. In the embodiment, the organic EL material is a low-molecular material that emits white light.

In the embodiment, the electron-transporting layer 28 is formed of Alq3 (tris(8-quinolinolato)aluminum complex).

As shown in FIG. 1, an opposite electrode 18 is disposed on the light emission functional layer 16. The opposite electrode 18 is a cathode and includes a mixture layer 30 disposed on the electron-transporting layer 28 of the light emission functional layer 16 and an electrically conductive layer 40 disposed on the mixture layer 30.

The mixture layer 30 is formed by mixing an electron-injecting material and a reducing material for reducing the electron-injecting material. The electron-injecting material is a material for enhancing the efficiency of electron injection to the light emission functional layer 16. In order to enhance the efficiency of electron injection to the light emission functional layer 16, it is desirable that the potential barrier between the cathode and the light emission functional layer 16 is small. Therefore, the electron-injecting material is preferably a metal compound, for example, a halide (in particular, fluoride) or an oxide of a metal having a work function of 3.5 eV or less, such as alkali metals, alkaline-earth metals, and rare-earth metals. In the embodiment, the electron-injecting material is LiF (lithium fluoride), and the reducing material is Al.

As described below, in the embodiment, the mixture layer 30 is formed by codepositing LiF and Al on the light emission functional layer 16. In the embodiment, the deposition rate ratio of LiF to Al (deposition rate of the electron-injecting material/deposition rate of the reducing material) is 1 (that is, deposition rate of LiF: deposition rate of Al=1:1).

In order to efficiently extract light emitted by the light emission functional layer 16 to the observing side, it is desirable that the mixture layer 30 have a minimized thickness. Specifically, the thickness of the mixture layer 30 is preferably 5 nm or less. In the embodiment, the thickness of the mixture layer 30 is 2 nm.

The electrically conductive layer 40 shown in FIG. 1 functions as a semitransparent reflective layer having a property transmitting part of light that reaches the surface thereof and reflecting the other part of the light (that is, semitransparent reflection property) and is formed of, for example, a simple metal such as Ag or an alloy whose main component is Ag. In the embodiment, the electrically conductive layer 40 is formed of Ag and has a thickness of 10 nm.

In the light-emitting element U1 of the embodiment, a resonator structure that resonates light emitted by the light emission functional layer 16 between the light-reflecting layer 12 and the electrically conductive layer 40 is formed. By this structure, light with a specific wavelength can be efficiently extracted.

Figure 2:
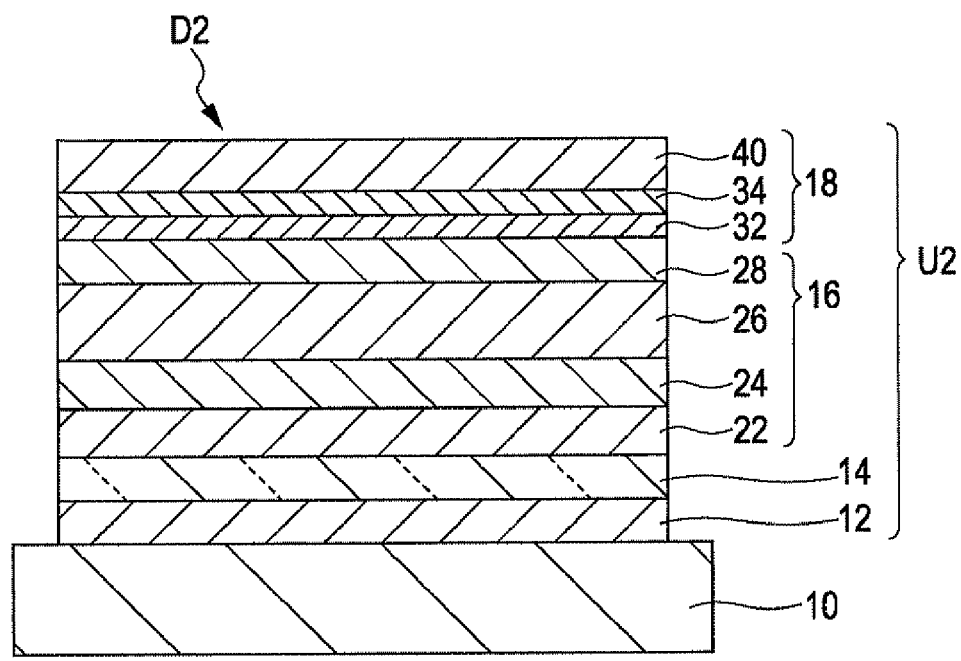
FIG. 2 is a schematic cross-sectional view showing an outline of an organic EL device according to a comparative embodiment.

FIG. 2 is a schematic cross-sectional view showing an outline of a structure (hereinafter, referred to as "comparative embodiment") that is different from the embodiment in that the opposite electrode 18 is composed of an electron-injecting layer 32, a reduction layer 34, and an electrically conductive layer 40. In FIG. 2, the electron-injecting layer 32 is composed of LiF and is disposed on the electron-transporting layer 28 of the light emission functional layer 16. The thickness of the electron-injecting layer 32 is 1 nm. In addition, the reduction layer 34 is composed of Al and is disposed on the electron-injecting layer 32. The thickness of the reduction layer 34 is 1 nm. Furthermore, the electrically conductive layer 40 is disposed on the reduction layer 34. Configuration other than the above is the same as that of the embodiment.

Figure 3:
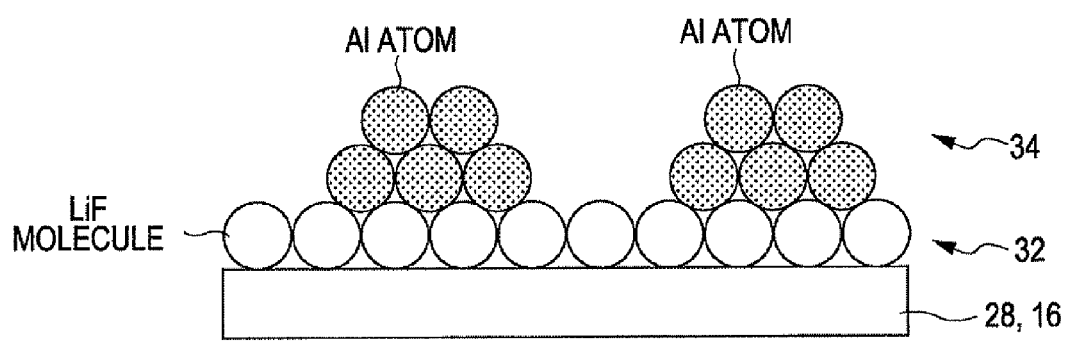
FIG. 3 is a conceptual diagram schematically illustrating LiF molecules and Al atoms in the comparative embodiment of FIG. 2.

FIG. 3 is a conceptual diagram schematically illustrating LiF molecules constituting the electron-injecting layer 32 and Al atoms constituting the reduction layer 34 in the comparative embodiment in FIG. 2. Since forces (aggregation forces) binding the Al atoms to one another are present among the Al atoms that constitute the reduction layer 34. Consequently, when the thickness is 20 nm or less, the Al atoms aggregate into island-like shapes, and thereby a uniform film cannot be formed. Since the thickness of the reduction layer 34 in the comparative embodiment is 1 nm, as shown in FIG. 3, the Al atoms aggregate into island-like shapes to form a discontinuous film. This causes a problem that the electrical conductivity of the light-emitting element is decreased.

The aggregation of the Al atoms into island-like shapes forms irregularities on the light emission functional layer 16, and, thereby, the light emitted by the light emission functional layer 16 is scattered in all directions by the irregularities. This also causes a problem that the amount of light that penetrates to the observing side is decreased.

Figure 4:
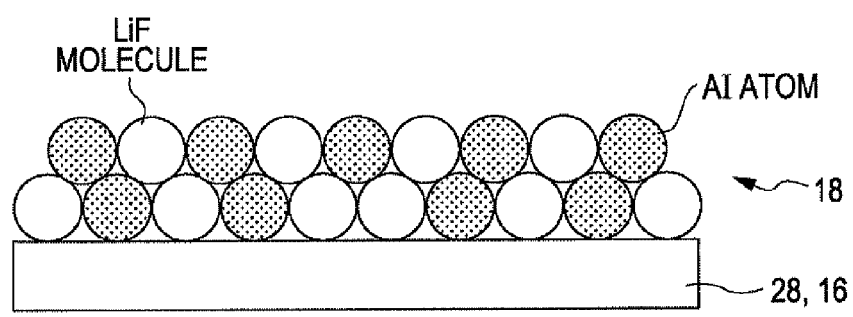
FIG. 4 is a conceptual diagram schematically illustrating LiF molecules and Al atoms in the embodiment of FIG. 1.

FIG. 4 is a conceptual diagram schematically illustrating LiF molecules and Al atoms forming the mixture layer 30 in the embodiment. Since the mixture layer 30 in the embodiment is formed of a mixture of LiF molecules and Al atoms, as shown in FIG. 4, the aggregation of the Al atoms is inhibited by the LiF molecules intervening between the Al atoms. This enables the mixture layer 30 formed on the light emission functional layer 16 to be a flat continuous film. Thus, there are advantages that the electrical conductivity of the light-emitting element can be better than that in the comparative embodiment, and also a decrease in the amount of light that penetrates to the observing side can be suppressed compared to that in the comparative embodiment.

FIG. 5 is a diagram showing measurement results of various types of data of the light-emitting element U1 in the embodiment and the light-emitting element U2 in the comparative embodiment when the thicknesses of the pixel electrode 14 and each layer of the light emission functional layer 16 are adjusted such that green light can be efficiently extracted from white light emitted by the light emission functional layer 16 and the density of current flowing in the opposite electrode 18 is set to 17.5 mA/cm$^2$. In FIG. 5, Rs denotes the sheet resistance of the opposite electrode 18, and a smaller value thereof means a smaller serial resistance component of the light-emitting element. The luminance shown in FIG. 5 denotes the intensity of light emitted from the light-emitting element to the observing side, and the voltage shown in FIG. 5 denotes the voltage applied between the pixel electrode 14 and the opposite electrode 18. The current efficiency shown in FIG. 5 denotes luminous intensity at a current of 1 A in the light-emitting element.

As shown in FIG. 5, the sheet resistance Rs of the light-emitting element U1 in the embodiment is smaller than that of the light-emitting element U2 in the comparative embodiment, and the luminance value of the light-emitting element U1 in the embodiment is larger than that of the light-emitting element U2 in the comparative embodiment. That is, it is confirmed that the electrical conductivity of the light-emitting element according to the embodiment can be better than that in the comparative embodiment, and also a decrease in the amount of light that penetrates to the observing side can be suppressed compared to that in the comparative embodiment.

B: Process of Producing Organic EL Device

Next, a process of producing the organic EL device D1 of this embodiment will be described with reference to FIGS. 6A and 6B, 7A to 7D, 8A and 8B.

Figure 6A:
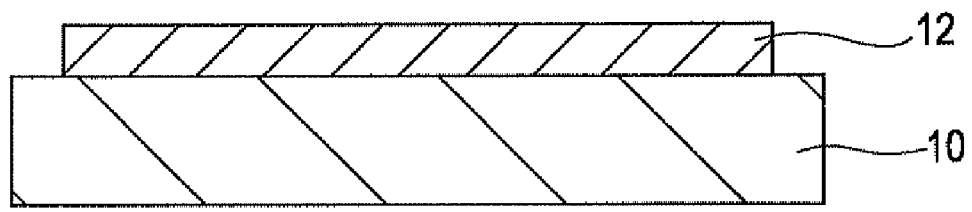
FIG. 6A is a process diagram illustrating a process of producing a light-emitting element.
Figure 6B:
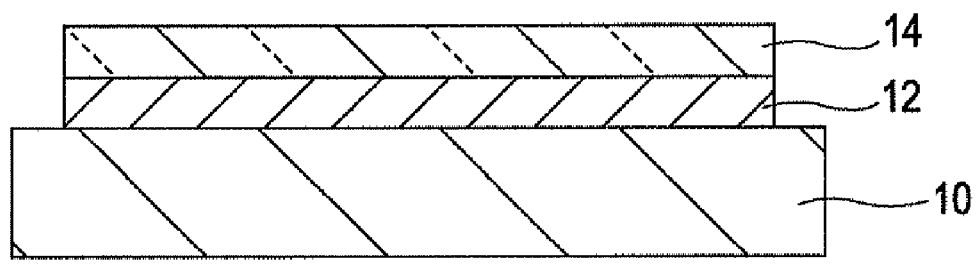

First, a light-reflecting layer 12 is formed on a surface of a substrate 10 (step A1: FIG. 6A). Subsequently, a pixel electrode 14 is formed on the light-reflecting layer 12 (step A2: FIG. 6B). Though it is not shown in the drawing, in a case of the configuration in which the pixel electrode 14 made of a light-reflective metal is directly formed on the substrate 10, the pixel electrode 14 is first formed on a surface of the substrate 10.

Figure 7A:
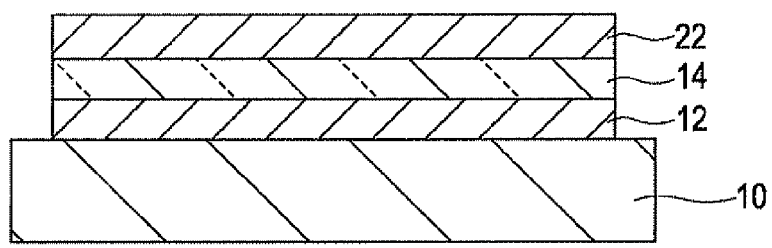
FIG. 7A is a process diagram illustrating the process of producing the light-emitting element.
Figure 7B:
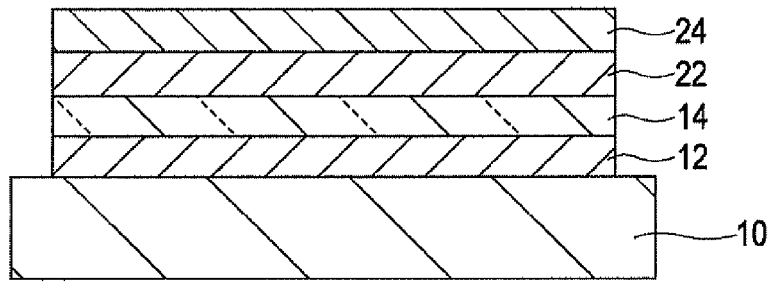
FIG. 7B is a process diagram illustrating the process of producing the light-emitting element.
Figure 7C:
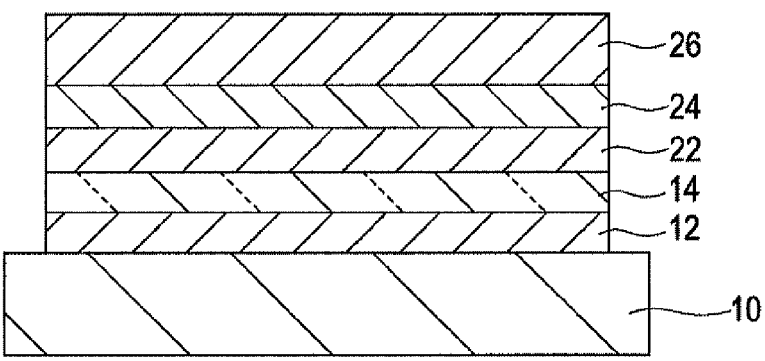
FIG. 7C is a process diagram illustrating the process of producing the light-emitting element.
Figure 7D:
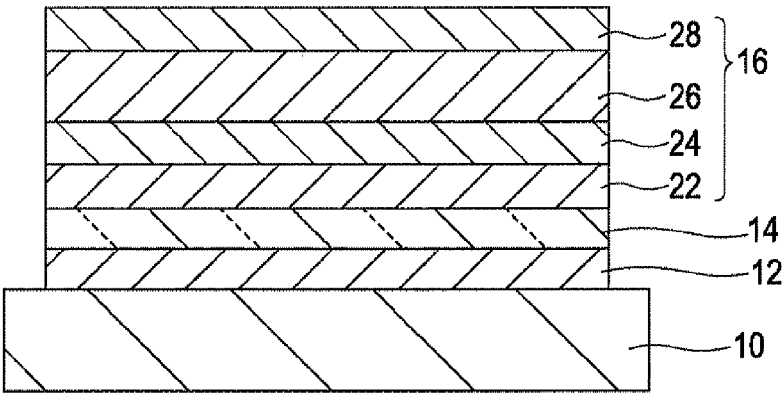
FIG. 7D is a process diagram illustrating the process of producing the light-emitting element.

Then, a light emission functional layer 16 is formed on the pixel electrode 14 (steps A3 to A6: FIGS. 7A to 7D). More specifically, the light emission functional layer 16 is formed as follows: First, a hole-injecting layer 22 is formed on the pixel electrode 14 (step A3: FIG. 7A). Subsequently, a hole-transporting layer 24 is formed on the hole-injecting layer 22 (step A4: FIG. 7B). Then, a light-emitting layer 26 is formed on the hole-transporting layer 24 (step A5: FIG. 7C). Furthermore, an electron-transporting layer 28 is formed on the light-emitting layer 26 (step A6: FIG. 7D). Each layer from the light-reflecting layer 12 to the electron-transporting layer 28 is formed by various known methods for forming films, such as deposition and sputtering.

Figure 8A:
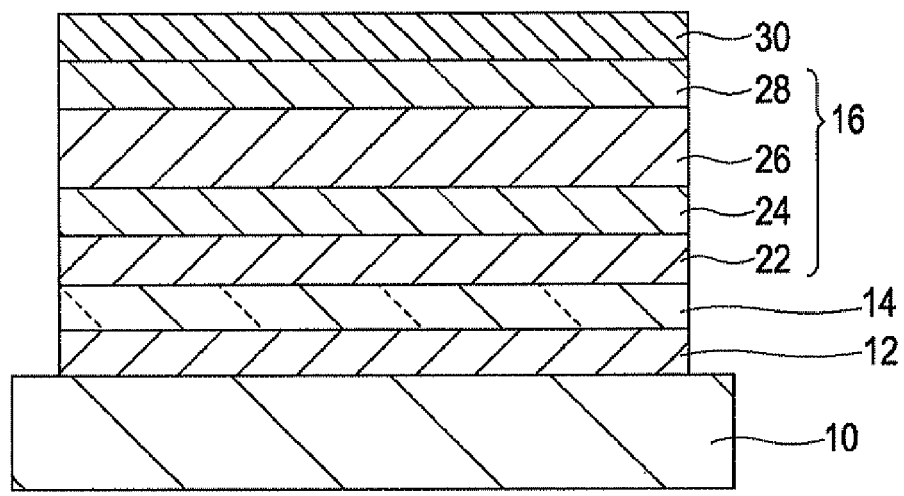
FIG. 8A is a process diagram illustrating the process of producing the light-emitting element.
Figure 8B:
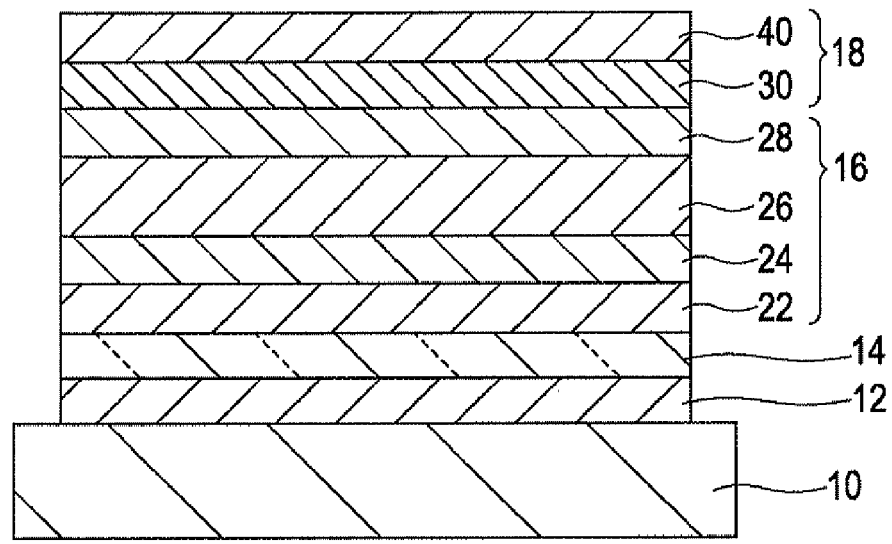
FIG. 8B is a process diagram illustrating the process of producing the light-emitting element.

Subsequently, an opposite electrode 18 is formed on the light emission functional layer 16 (steps A7 and A8: FIGS. 8A and 8B). More specifically, the opposite electrode 18 is formed as follows: First, a mixture layer 30 is formed on the electron-transporting layer 28 of the light emission functional layer 16 (step A7: FIG. 8A). Subsequently, an electrically conductive layer 40 is formed on the mixture layer 30 (step A8: FIG. 8B).

In the step A7, the mixture layer 30 is formed by codepositing LiF as an electron-injecting material and Al as a reducing material on the electron-transporting layer 28 of the light emission functional layer 16. In the embodiment, the deposition rate ratio of LiF to Al (deposition rate of the electron-injecting material/deposition rate of the reducing material) is 1. According to the above-described process, the organic EL device D1 is produced.

C: Modification Embodiment

The invention is not limited to the above-described embodiment, and, for example, the following modifications are possible. Furthermore, a combination of two or more of the following modifications is possible.

(1) Modification 1

In the above-described embodiment, LiF is employed as the electron-injecting material, but the electron-injecting material is not limited thereto and can be composed of a metal compound containing any of alkali metals, alkaline-earth metals, and rare-earth metals. Examples of the alkali metals, alkaline-earth metals, and rare-earth metals include Li, Ca, Sr, Ba, Nd, Sm, Yb, and Mg. In addition, in the above-described embodiment, Al is employed as the reducing material, but the reducing material is not limited thereto and may be any material that can reduce the electron-injecting material.

(2) Modification 2

In the above-described embodiment, in the step A7 for forming the mixture layer 30, the deposition rate ratio of LiF to Al is 1, but the deposition rate ratio is not limited thereto and can be properly set within the range in which the LiF molecules intervening between the Al atoms can prevent the Al atoms from aggregating. For example, the deposition rate ratio of LiF to Al can be properly set within in the range of 0.1 to 10.

(3) Modification 3

In the above-described embodiment, the light-emitting layer 26 of the light emission functional layer 16 is formed of a low-molecular organic EL material but may be formed of a high-molecular organic EL material. In such a case, the light-emitting layer 26 is formed by ink jetting or spin coating.

(4) Modification 4

In the above-described embodiment, the light-emitting layer 26 of the light emission functional layer 16 is formed of an organic EL material emitting white light but is not limited thereto. The light-emitting layer 26 can be formed of, for example, an organic EL material that emits light having a wavelength in the range of any of R (red), G (green), and B (blue).

(5) Modification 5

In the above-described embodiment, a resonator structure is formed between the light-reflecting layer 12 and the electrically conductive layer 40, but a configuration in which the resonator structure is not formed between the light-reflecting layer 12 and the electrically conductive layer 40 can be employed.

(6) Modification 6

In the above-described embodiment, the electrically conductive layer 40 functions as a semitransparent reflective layer, but the configuration is not limited thereto. For example, the electrically conductive layer 40 is formed of a transparent conductive oxide such as ITO, and a semitransparent reflective layer may be further formed thereon.

(7) Modification 7

In the above-described embodiment, a top-emission organic EL device is exemplary shown, but the organic EL device is not limited thereto and can be a bottom-emission type.

The entire disclosure of Japanese Patent Application No. 2008-218045, filed Aug. 27, 2008 is expressly incorporated by reference herein.

What is claimed is:

1. An organic EL device comprising:
    a light-emitting element including a first electrode disposed above a substrate, a second electrode arranged above the first electrode, and a light emission functional layer arranged between the first and second electrodes, a light which is emitted from the light emission layer exiting from a second electrode side with respect to the light emission layer, wherein
    the second electrode includes a mixture layer composed of a mixture of an electron-injecting material and a reducing material for reducing the electron-injecting material and a transparent electrically conductive layer formed on the mixture layer.

2. The organic EL device according to claim 1, wherein the electron-injecting material is composed of a metal compound containing any of alkali metals, alkaline-earth metals, and rare-earth metals.

3. The organic EL device according to claim 2, wherein the metal compound contains any of Li, Ca, Sr, Ba, Nd, Sm, Yb, and Mg.

4. The organic EL device according to claim 1, wherein the electron-injecting material is lithium fluoride; and the reducing material is aluminum.

5. The organic EL device according to claim 1, wherein the mixture layer has a thickness of 5 nm or less.

6. The organic EL device according to claim 1, wherein the first electrode is made of a metal having light reflectivity; or the first electrode is made of a translucent material and is disposed on a light-reflecting layer that is arranged on the substrate.

* * * * *